United States Patent
Fang et al.

(10) Patent No.: US 11,895,923 B2
(45) Date of Patent: Feb. 6, 2024

(54) LEAD-FREE PIEZOELECTRIC CERAMIC SENSOR MATERIAL AND A PREPARATION METHOD THEREOF

(71) Applicant: Hunan Meicheng Ceramic Technology Co., Ltd, Loudi (CN)

(72) Inventors: Haojie Fang, Loudi (CN); Yiwen He, Loudi (CN); Xiaoyun Zhang, Loudi (CN); Guanjun Qiao, Loudi (CN); Dou Zhang, Loudi (CN); Meiling Fang, Loudi (CN); Chao Zeng, Loudi (CN)

(73) Assignee: Hunan Meicheng Ceramic Technology Co., Ltd, Loudi (CN)

( * ) Notice: Subject to any disclaimer, the term of this patent is extended or adjusted under 35 U.S.C. 154(b) by 263 days.

(21) Appl. No.: 17/401,313

(22) Filed: Aug. 13, 2021

(65) Prior Publication Data
US 2022/0344574 A1   Oct. 27, 2022

(30) Foreign Application Priority Data

Apr. 25, 2021   (CN) .................... 202110445772.6

(51) Int. Cl.
| | |
|---|---|
| *H10N 30/853* | (2023.01) |
| *C04B 35/01* | (2006.01) |
| *H10N 30/097* | (2023.01) |
| *C04B 35/626* | (2006.01) |
| *C04B 35/632* | (2006.01) |
| *C04B 35/634* | (2006.01) |
| *C04B 41/51* | (2006.01) |
| *C04B 35/638* | (2006.01) |
| *C04B 35/64* | (2006.01) |
| *C04B 35/49* | (2006.01) |
| *H10N 30/045* | (2023.01) |
| *C04B 35/63* | (2006.01) |

(52) U.S. Cl.
CPC ....... *H10N 30/8536* (2023.02); *C04B 35/013* (2013.01); *C04B 35/49* (2013.01); *C04B 35/62615* (2013.01); *C04B 35/62695* (2013.01); *C04B 35/632* (2013.01); *C04B 35/6303* (2013.01); *C04B 35/638* (2013.01); *C04B 35/63416* (2013.01); *C04B 35/64* (2013.01); *C04B 41/5116* (2013.01); *H10N 30/045* (2023.02); *H10N 30/097* (2023.02); *C04B 2235/3203* (2013.01); *C04B 2235/3208* (2013.01); *C04B 2235/3213* (2013.01); *C04B 2235/3215* (2013.01); *C04B 2235/3225* (2013.01); *C04B 2235/3232* (2013.01); *C04B 2235/3244* (2013.01); *C04B 2235/3298* (2013.01); *C04B 2235/483* (2013.01); *C04B 2235/602* (2013.01); *C04B 2235/661* (2013.01)

(58) Field of Classification Search
CPC .... H10N 30/045; H10N 30/07; H10N 30/097; H10N 30/8536; C04B 35/49; C04B 35/6261; C04B 35/62655; C04B 35/62695; C04B 35/62685; C04B 35/63416; C04B 35/638; C04B 35/64; C04B 2235/3203; C04B 2235/3208; C04B 2235/3213; C04B 2235/3215; C04B 2235/3224; C04B 2235/3225; C04B 2235/3232; C04B 2235/3244; C04B 2235/3298
See application file for complete search history.

(56) References Cited

FOREIGN PATENT DOCUMENTS

| | | | |
|---|---|---|---|
| CN | 103214241 | * | 7/2013 |
| CN | 204535913 U | | 8/2015 |
| CN | 208721286 U | | 4/2019 |
| CN | 212851004 U | | 3/2021 |

* cited by examiner

*Primary Examiner* — C Melissa Koslow
(74) *Attorney, Agent, or Firm* — Nitin Kaushik

(57) ABSTRACT

A lead-free piezoelectric ceramic sensor material and a preparation method thereof and relates to the technical field of piezoelectric ceramic processing. The main raw materials of the lead-free piezoelectric ceramic sensor material disclosed in the present disclosure are a barium carbonate, a calcium carbonate, a zirconia, a titanium dioxide, a strontium carbonate, an erbium oxide, and a bismuth oxide. The preparation method is prepared through the steps of preparing ingredients, ball milling, granulating and tableting, debinding, and sintering, and the lead-free piezoelectric ceramic sensor material can be made into a lead-free piezoelectric sensor through applying an electrode and electrode polarizing. The present disclosure has an excellent compactness and a good chemical stability. And the piezoelectric sensor made of the lead-free piezoelectric ceramic sensor material has a high sensitivity, a strong working stability, an excellent piezoelectric and has a high Curie temperature.

10 Claims, No Drawings

LEAD-FREE PIEZOELECTRIC CERAMIC SENSOR MATERIAL AND A PREPARATION METHOD THEREOF

CROSS-REFERENCE TO RELATED APPLICATIONS

The application claims priority to Chinese patent application No. 202110445772.6, filed on Apr. 25, 2021, the entire contents of which are incorporated herein by reference.

TECHNICAL FIELD

The present disclosure belongs to the technical field of piezoelectric ceramic materials, and in particular relates to a lead-free piezoelectric ceramic sensor material and a preparation method thereof.

BACKGROUND

The piezoelectric ceramic refers to a polycrystal formed by mixing oxides (zirconia, lead oxide, titanium oxide, etc.), sintering at high temperature, and solid-phase reaction, and the general term for ferroelectric ceramic that are made with piezoelectric effect through direct current high-voltage polarization treatment. Piezoelectric ceramic is an important part of functional ceramic. After the Curie brothers discovered the piezoelectric effect in the 1880s, the piezoelectric ceramic has been rapidly researched and developed. At present, the research on piezoelectric effect is mainly in three aspects: the piezoelectric ceramic, a piezoelectric polymer, and a piezoelectric crystal, and the piezoelectric ceramic have the most piezoelectric effect. As an important functional material with strong force, heat, electricity and light sensitivity, piezoelectric ceramic have been widely used in sensors, ultrasonic transducers, micro-displacers and other electronic devices. With the progress and optimization of processing technology, piezoelectric ceramic has high research and application value in aerospace, electronics, information and other high-tech fields due to their low cost and high-voltage power conversion advantages.

A piezoelectric ceramic sensor has important applications in many aspects of people's lives, but the piezoelectric ceramic materials currently used in large quantities in the world are still traditional lead-containing piezoelectric ceramic, whose lead element content is as high as 60% or more. Lead oxide is a volatile toxic substance, which will cause damage to humans and the ecological environment during production, preparation, use and disposal after disposal. With the increasing awareness of environmental protection, the international community is actively banning lead-containing electronic products through laws, regulations, and government directives. The volatilization of high-temperature sintered PbO not only pollutes the environment, but also causes the stoichiometric ratio of the ceramic to be higher, which affects the performance of the material. Therefore, lead-free piezoelectric ceramic has gradually become one of the hotspots in the research of piezoelectric ceramic sensor materials.

At present, the main research directions of lead-free piezoelectric ceramic are: a barium titanate based, a niobate based, a BNT-based and other lead-free piezoelectric ceramic systems. The Curie temperature of the existing barium titanate based piezoelectric ceramic is lower than other piezoelectric ceramic (Tc=120° C.), and the various electrical properties of the barium titanate based piezoelectric ceramic are poor, and its various properties are difficult to be effectively improved by doping, which limits its wide application; and niobate based lead-free piezoelectric ceramic has low density and good piezoelectric properties. therefore, the niobate based lead-free piezoelectric ceramic is good backup material for the preparation of piezoelectric materials and high-frequency transducers. However, there are no reports about its application in sensors. BNT lead-free piezoelectric ceramic has good piezoelectric properties and are considered to be a piezoelectric material that may replace PZT ceramic. However, the ceramic system has a higher coercive field, the compactness and chemical stability of the ceramic are poor, and the sintering temperature is narrow, so, compared with PZT ceramic, there is still a gap in the performance of the BNT lead-free piezoelectric ceramic and the existing BNT ceramic is difficult to apply. Therefore, the development of a lead-free piezoelectric ceramic material with excellent piezoelectricity, stability and higher Curie temperature will become the research and development direction of lead-free piezoelectric ceramic sensors.

SUMMARY

The purpose of the present disclosure is to provide a lead-free piezoelectric ceramic sensor material, which is simple to operate, does not contain lead in the piezoelectric ceramic material, has excellent compactness and good chemical stability. And the prepared piezoelectric sensor has high sensitivity and workability, strong stability, excellent piezoelectric properties, dielectric properties, mechanical properties, and a high Curie temperature.

A lead-free piezoelectric ceramic sensor material is provided to achieve the disclosure's purpose. The lead-free piezoelectric ceramic sensor material; wherein: in terms of a mass percentage, the lead-free piezoelectric ceramic sensor material is produced using following main raw materials: barium carbonate 32.8-35.3%, calcium carbonate 34.4-38.7%, zirconia 8.5-10.3%, titanium dioxide 8.6-11.0%, strontium carbonate 3.8-5.2%, erbium oxide 2.4-3.7% and bismuth oxide 1.5-4.2%; the lead-free piezoelectric ceramic sensor material is produced further using lithium oxide, yttrium oxide, composite binder and dispersant agent.

Further, a mass of the lithium oxide is 0.21-0.35% of a total amount of a main raw materials, and the mass of the yttrium oxide is 0.18-0.29% of the total amount of the main raw materials, the mass of the composite binder is 3.5-4.5% of the total amount of the main raw materials and the mass of the dispersant agent is 0.3-0.6% of the total amount of the main raw materials.

Further, the composite binder is prepared by reacting polyvinyl alcohol with polysiloxane compound under an action of triethanolamine; the polysiloxane compound is a waterborne film-forming protective agent R-23™ produced by a Dining Huakai Resin Co., Ltd, and a mass ratio of the polyvinyl alcohol and the polysiloxane compound is 1: (0.5-0.8). The waterborne film-forming protective agent R-23™ is dimethylpolysiloxane.

A preparation method of the composite binder, comprising: adding 2 times a mass of the triethanolamine into the polyvinyl alcohol under a room temperature, adding organosiloxane compound, and then stirring a mixture of the polyvinyl alcohol, the triethanolamine and the organosiloxane compound under a constant temperature of 60° C. for 1.5 hours, filtering, washing with deionized water, and drying to obtain a required composite binder.

Further, the dispersant agent is one or more of sodium citrate, sodium silicate, sodium hexametaphosphate or sodium tripolyphosphate.

A preparation method of the lead-free piezoelectric ceramic sensor material, comprising the following steps:

(1) preparing ingredients: according to the mass percentage, weighing and taking a required mass of the barium carbonate, the calcium carbonate, the zirconia, the titanium dioxide, the strontium carbonate, the oxidation bait and the bismuth oxide, mixing uniformly to prepare a mixed raw materials;

(2) ball milling: adding the mixed raw materials into a high-energy ball mill, then adding ⅓ of a required mass of the dispersant agent, starting a wet ball milling, and a mass ratio of the mixed raw materials and the deionized water is 1:1, a ball milling rate is 320-380 r/min, preforming a ball milling for 4-5 h; then continuing to adding the lithium oxide, the yttrium oxide and a remaining ⅔ mass dispersant agent into the high-energy ball mill, starting a secondary ball milling and the ball milling rate is 320-380 r/min, and preforming the ball milling for 10 h;

(3) granulating and tableting: suction filtering a slurry after ball milling, and then processing the slurry after ball milling into a 400 mesh granular ceramic powder through a centrifugal spray dryer; uniformly mixing the 400 mesh granular ceramic powder with an absolute ethyl alcohol in a mass ratio of 1:0.3, adding the composite binder, and after mixing uniformly, heating up to 70° C., stirring for 1 h, and then granulating; and placing pellets in a stainless steel mold and pressing the pellets into a green body with a required thickness under a pressure of 12-18 MPa;

(4) debinding: putting the green body in a heating furnace, heating up to 200-250° C., for 60 minutes; and then heating up to 500-600° C. at a rate of 3-5° C./min for 2 h; then heating up to 720-780° C. for 3 h;

(5) sintering: putting a debinding green body in a clamp pot, covering tightly, and sintering at 1050-1180° C., for 3-4 h; and then naturally cooling the debinding green body to the room temperature, and preparing the lead-free piezoelectric ceramic sensor material;

(6) applying an electrode: cleaning the lead-free piezoelectric ceramic sensor material, and then using a screen printing technology to print a silver paste on an upper surface and a lower surface of the lead-free piezoelectric ceramic sensor material, and putting a printed silver product in the heating furnace, heating up to 800° C., for 50-60 minutes, waiting the printed silver product cooling to the room temperature, and preparing a piezoelectric ceramic silver sheet;

(7) polarizing: polarizing the piezoelectric ceramic silver sheet by a direct current electric field, a polarization temperature is from 110 to 130° C., a polarization time is 30 min, and a polarization field strength is 3-6 kV/mm, and preparing the lead-free piezoelectric ceramic sensor.

The present disclosure has achieved the following beneficial effects:

1. The present disclosure is a multi-element composite ceramic material produced using barium carbonate, calcium carbonate, zirconia and titanium dioxide as main components. The ceramic material does not contain lead, and will not produce volatile and toxic lead oxide during high-temperature sintering, and in the process of disposal, it will not harm human beings and the ecological environment. The multi-element composite ceramic material is added with zirconia in the perovskite structure, which is mainly barium titanate and calcium titanate, making the ceramic material excellent in compactness, improving the high temperature strength and toughness of ceramic materials and the dielectric properties and piezoelectric properties of ceramic materials, and further increasing the Curie temperature of the piezoelectric sensor.

2. Strontium carbonate is added in the present disclosure, since the decomposition temperature of strontium carbonate is relatively low, and it is easy to decompose. Therefore, before the ceramic body is fused and sealed, the strontium carbonate has decomposed its internal $CO_2$. Therefore, under high temperature conditions, the non-viscosity of glass phase of strontium carbonate drops too low and overburns bubbles, which improves the compactness of the lead-free ceramic material of the present disclosure, and makes the ceramic material have higher wear resistance, mechanical strength and toughness and reduces the shrinkage rate of ceramic materials and the deformation rate of the ceramic body. Strontium oxide has a good solubilizing effect. Strontium carbonate is decomposed into strontium oxide under the action of high temperature, which reduces the sintering temperature of the ceramic body, so that the disclosure can be sintered into lead-free piezoelectric ceramic material at 1050° C. Strontium carbonate can form perovskite structure strontium titanate in the sintering process, which improves the piezoelectric coefficient of lead-free piezoelectric ceramic so as to greatly improve the piezoelectric performance of piezoelectric ceramic sensors.

3. The addition of erbium oxide in the present disclosure can accelerate the electron transfer between the lead-free ceramic material and the electrode, improving the chemical stability of lead-free ceramic materials, and making the prepared lead-free piezoelectric sensor have good stability and reproducibility and further improving the piezoelectric performance of the lead-free piezoelectric sensor. By adding and synergizing the erbium oxide and the bismuth oxide, the present disclosure increases the electrical conductivity of the lead-free ceramic material, and further improves the piezoelectric coefficient and Curie temperature of the piezoelectric sensor, and the sensitivity is higher.

4. In the present disclosure, lithium oxide and yttrium oxide are added as a sintering aid for lead-free ceramic materials, reducing the sintering temperature of the ceramic body, contributing to the diffusion and migration of grain boundaries, and improving the density and mechanical properties of lead-free ceramic materials.

5. The composite binder is prepared by reacting a polyvinyl alcohol with a polysiloxane compound under an action of a triethanolamine. The composite binder can cross-link with the metal oxide in the ceramic material to form a network structure and to form a dense ceramic matrix with a well suppleness. And the composite binder is sintered and carbonized at high temperature to form silicon carbide or silicon oxide, which is conducive to the diffusion and migration of grain boundaries, thereby greatly improving the temperature resistance and mechanical properties of ceramic materials.

6. The disclosure adopts lead-free piezoelectric ceramic material based on barium carbonate, calcium carbonate, zirconia and titanium dioxide. The preparation method is simple, easy to operate, and has low dielectric constant and low dielectric loss, and since it has excellent mechanical properties, it is not easy to break. The lead-free piezoelectric ceramic sensor prepared by the disclosure has good stability, high Curie temperature, and excellent piezoelectric and mechanical properties.

DETAILED DESCRIPTION OF THE EMBODIMENTS

The following describes the technical solutions in the embodiments of the present disclosure clearly and completely. Obviously, the described embodiments are only a part of the embodiments of the present disclosure, rather than all the embodiments. Based on the embodiments of the present disclosure, all other embodiments obtained by those of ordinary skill in the art without creative work shall fall within the protection scope of the present disclosure.

The lead-free piezoelectric ceramic sensor material and the lead-free piezoelectric ceramic sensor of the present disclosure and the preparation method thereof will be described below with reference to specific embodiments.

Embodiment 1 the preparation method of the lead-free piezoelectric ceramic sensor material, comprising the following steps:

(1) preparing ingredients: weighing and taking 328 g $BaCO_3$, 387 g $CaCO_3$, 85 g $ZrO_2$, 110 g $TiO_2$, 38 g $SrCO_3$, 37 g $Er_2O_3$ and 15 g $Bi_2O_3$ and mixing them uniformly to prepare the mixed raw materials.

(2) Ball milling: adding the mixed raw materials into a high-energy ball mill, and then adding 2 g sodium hexametaphosphate, starting a wet ball milling and the ball milling medium is steel ball, and adding 5 kg steel balls and 1 kg deionized water, a ball milling rate is 320-380 r/min, preforming the ball milling for 4-5 h. Continuing to adding 3.5 g $Li_2O$, 2.9 g $Y_2O_3$ and 4 g sodium hexametaphosphate into the high-energy ball mill, starting a secondary ball milling and during the second ball milling process, 0.5 kg of deionized water needs adding into the high-energy ball mill, and the ball milling rate is 320-380 r/min, and preforming the ball milling for 10 h.

(3) Granulating and tableting: suction filtering a slurry after ball milling, and then processing the slurry after ball milling into a 400 mesh granular ceramic powder through a centrifugal spray dryer, uniformly mixing the 400 mesh granular ceramic powder with an absolute ethyl alcohol in a mass ratio of 1:0.3, adding 35 g composite binder, and after mixing uniformly, heating up to 70° C., stirring for 1 h, and then granulating; and placing pellets in a stainless steel mold and pressing the pellets into a green body with a required thickness under a pressure of 12-18 MPa.

The composite binder is prepared by reacting a polyvinyl alcohol with a polysiloxane compound under an action of a triethanolamine; the polysiloxane compound is a waterborne film-forming protective agent R-23™ produced by a Dining Huakai Resin Co., Ltd. The waterborne film-forming protective agent R-23™ is dimethylpolysiloxane. The preparation method of the composite binder, comprising: adding 200 g triethanolamine into 100 g polyvinyl alcohol under a room temperature, and then adding 50 g polysiloxane compound, and then stirring a mixture of the polyvinyl alcohol, the triethanolamine and the polysiloxane compound under a constant temperature of 60° C. for 1.5 hours, filtering, washing with a deionized water, and drying to obtain a required composite binder.

(4) Debinding: putting the green body in a heating furnace, heating up to 200-250° C., for 60 minutes; and then heating up to 500-600° C. at a rate of 5° C/min for 2h; then heating up to 720-780° C. for 3h.

(5) Sintering: putting a debinding green body in a clamp pot, covering tightly, and sintering at 1180° C. for 3-4h; and then naturally cooling the debinding green body to the room temperature, and preparing the lead-free piezoelectric ceramic sensor material A1.

Embodiment 2 the preparation method of the lead-free piezoelectric ceramic sensor material, comprising the following steps:

(1) preparing ingredients: weighing and taking 353 g $BaCO_3$, 344 g $CaCO_3$, 103 g $ZrO_2$, 86 g $TiO_2$, 52 g $SrCO_3$, 24 g $Er_2O_3$ and 38 g $Bi_2O_3$, and mixing them uniformly to prepare the mixed raw material.

(2) Ball milling: adding the mixed raw material into a high-energy ball mill, and then adding 1 g sodium silicate, starting a wet ball milling and the ball milling medium is steel ball, and adding 5 kg steel balls and 1 kg deionized water, a ball milling rate is 320-380 r/min, preforming the ball milling for 4-5 h. Continuing to adding 2.1 g $Li_2O$, 1.8 g $Y_2O_3$ and 2 g sodium silicate into the high-energy ball mill, starting a secondary ball milling and during the second ball milling process, 0.5 kg of deionized water needs adding into the high-energy ball mill, and the ball milling rate is 320-380 r/min, and preforming the ball milling for 10 h.

(3) Granulating and tableting: suction filtering a slurry after ball milling, and then processing the slurry after ball milling into a 400 mesh granular ceramic powder through a centrifugal spray dryer, uniformly mixing the 400 mesh granular ceramic powder with an absolute ethyl alcohol in a mass ratio of 1:0.3, adding 45 g composite binder, and after mixing uniformly, heating up to 70° C., stirring for 1 h, and then granulating; and placing pellets in a stainless steel mold and pressing the pellets into a green body with a required thickness under a pressure of 12-18 MPa.

The composite binder is prepared by reacting a polyvinyl alcohol with a polysiloxane compound under an action of a triethanolamine. The mass ratio of the polyvinyl alcohol and the polysiloxane compound is 1:0.8.

(4) Debinding: putting the green body in a heating furnace, heating up to 200-250° C. for 60 minutes; and then heating up to 500-600° C. at a rate of 5° C./min for 2 h; then heating up to 720-780° C. for 3 h.

(5) Sintering: putting a debinding green body in a clamp pot, covering tightly, and sintering at 1180° C. for 3-4 h; and then naturally cooling the debinding green body to the room temperature, and preparing the lead-free piezoelectric ceramic sensor material A1.

Embodiment 3 the preparation method of the lead-free piezoelectric ceramic sensor material, comprising the following steps:

(1) preparing ingredients: weighing and taking 336 g $BaCO_3$, 364 g $CaCO_3$, 92 g $ZrO_2$, 92 g $TiO_2$, 48 g $SrCO_3$, 26 g $Er_2O_3$ and 42 g $Bi_2O_3$ and mixing them uniformly to prepare the mixed raw material.

(2) Ball milling: adding the mixed raw material into a high-energy ball mill, and then adding 1.5 g sodium tripolyphosphate, starting a wet ball milling and the ball milling medium is steel ball, and adding 5 kg steel balls and 1 kg deionized water, a ball milling rate is 320-380 r/min, preforming the ball milling for 4-5 h. Continuing to adding 3 g $Li_2O$, 2.5 g $Y_2O_3$ and 3 g sodium tripolyphosphate into the high-energy ball mill, starting a secondary ball milling and during the second ball milling process, 0.5 kg of deionized water needs adding into the high-energy ball mill, and the ball milling rate is 320-380 r/min, and preforming the ball milling for 10 h.

(3) Granulating and tableting: suction filtering a slurry after ball milling, and then processing the slurry after ball milling into a 400 mesh granular ceramic powder through a centrifugal spray dryer, uniformly mixing the 400 mesh granular ceramic powder with an absolute ethyl alcohol in a mass ratio of 1:0.3, adding 38 g composite binder, and after mixing uniformly, heating up to 70° C., stirring for 1 h, and then granulating; and placing pellets in a stainless steel mold and pressing the pellets into a green body with a required thickness under a pressure of 12-18 MPa.

The composite binder is prepared by reacting a polyvinyl alcohol with a polysiloxane compound under an action of a triethanolamine. The mass ratio of the polyvinyl alcohol and the polysiloxane compound is 1:0.6.

(4) Debinding: putting the green body in a heating furnace, heating up to 200-250° C. for 60 minutes; and then heating up to 500-600° C. at a rate of 5° C./min for 2 h; then heating up to 720-780° C. for 3 h.

(5) Sintering: putting a debinding green body in a clamp pot, covering tightly, and sintering at 1180° C., 3-4 h; and then naturally cooling the debinding green body to the room temperature, preparing the lead-free piezoelectric ceramic sensor material A1.

Embodiment 4 the preparation method of the lead-free piezoelectric ceramic sensor material, comprising the following steps:

(1) preparing ingredients: weighing and taking 349 g $BaCO_3$, 356 g $CaCO_3$, 87 g $ZrO_2$, 108 g $TiO_2$, 41 g $SrCO_3$, 36 g $Er_2O_3$ and 23 g $Bi_2O_3$, and mixing them uniformly to prepare the mixed raw material.

(2) Ball milling: adding the mixed raw material into a high-energy ball mill, and then adding 2 g sodium citrate, starting a wet ball milling and the ball milling medium is steel ball, and adding 5 kg steel balls and 1 kg deionized water, a ball milling rate is 320-380 r/min, preforming the ball milling for 4-5 h. Continuing to adding 2.6 g $Li_2O$, 2.8 g $Y_2O_3$ and 4 g sodium citrate into the high-energy ball mill, starting a secondary ball milling and during the second ball milling process, 0.5 kg of deionized water needs adding into the high-energy ball mill, and the ball milling rate is 320-380 r/min, and preforming the ball milling for 10 h.

(3) Granulating and tableting: suction filtering a slurry after ball milling, and then processing the slurry after ball milling into a 400 mesh granular ceramic powder through a centrifugal spray dryer, uniformly mixing the 400 mesh granular ceramic powder with an absolute ethyl alcohol in a mass ratio of 1:0.3, adding 42 g composite binder, and after mixing uniformly, heating up to 70° C., stirring for 1 h, and then granulating; and placing pellets in a stainless steel mold and pressing the pellets into a green body with a required thickness under a pressure of 12-18 MPa.

The composite binder is prepared by reacting a polyvinyl alcohol with a polysiloxane compound under an action of a triethanolamine. The mass ratio of the polyvinyl alcohol and the polysiloxane compound is 1:0.5.

(4) Debinding: putting the green body in a heating furnace, heating up to 200-250° C., for 60 minutes; and then heating up to 500-600° C. at a rate of 5° C./min for 2 h; then heating up to 720-780° C. for 3 h.

(5) Sintering: putting a debinding green body in a clamp pot, covering tightly, and sintering at 1180° C., for 3-4 h; and then naturally cooling the debinding green body to the room temperature, and preparing the lead-free piezoelectric ceramic sensor material A4.

Comparative example 1: a piezoelectric ceramic sensor material a1, whose preparation method is the same as that in the embodiment 3, while, the difference is that in the comparative example 1, the composition of the mixed raw materials is 349 g $BaCO_3$, 356 g $CaCO_3$, 87 g $ZrO_2$ and 108 g $TiO_2$.

Comparative example 2: a piezoelectric ceramic sensor material a2, whose material and preparation method are the same as that in the embodiment 3, while, the difference is that $SrCO_3$ is not added into the comparative example 2.

Comparative example 3: a piezoelectric ceramic sensor material a3, whose material and preparation method are the same as that in the embodiment 3, while the difference is that $Er_2O_3$ and $Bi_2O_3$ are not added into the comparative example 3.

Comparative example 4: a piezoelectric ceramic sensor material a4, whose material and preparation method are the same as that in the embodiment 3, except that the composite binder in the comparative example 4 is polyvinyl alcohol.

Testing the performance of the piezoelectric ceramic sensor materials prepared in the foregoing embodiments 1-4 and comparative examples 1-4, and the test results are shown in Table 1 below:

| | fracture toughness value (25° C., KIC/MPa · $m^{1/2}$) | | bending strength σ/MPa | |
|---|---|---|---|---|
| | parallel | perpendicular | parallel | perpendicular |
| A1 | 1.38 | 0.77 | 45.16 | 42.57 |
| A2 | 1.46 | 0.86 | 49.25 | 45.17 |
| A3 | 1.65 | 0.97 | 52.38 | 47.62 |
| A4 | 1.57 | 0.93 | 50.78 | 46.94 |
| a1 | 1.13 | 0.66 | 41.56 | 38.22 |
| a2 | 1.24 | 0.70 | 42.97 | 40.12 |
| a3 | 1.39 | 0.81 | 46.51 | 42.84 |
| a4 | 0.95 | 0.52 | 39.69 | 36.47 |

It can be seen from the test results in Table 1 that the piezoelectric ceramic sensor material prepared by the present disclosure has excellent mechanical strength and toughness. The composite binder has greatly improved strength and toughness of the present disclosure, and the addition of the strontium carbonate also improve the mechanical strength and fracture toughness of the present disclosure.

Cleaning the lead-free piezoelectric ceramic sensor material made in the embodiments 1-4 and comparative examples 1-4, and then using a screen printing technology to print a silver paste on an upper surface and a lower surface of the lead-free piezoelectric ceramic sensor material, and putting a printed silver product in the heating furnace, heating up to 800° C., for 50-60 minutes, waiting the printed silver product cooling to the room temperature, and producing piezoelectric ceramic silver sheet. Polarizing the piezoelectric ceramic silver sheet by a direct current electric field, a polarization temperature is from 110 to 130° C., a polarization time is 30 min, and a polarization field strength is 3-6 kV/mm, and finally the lead-free piezoelectric ceramic sensor is prepared. Wherein, the lead-free piezoelectric ceramic sensors prepared by the above-mentioned electrode application and polarization methods in the embodiments 1-4 are B1, B2, B3, and B4 respectively. And the lead-free piezoelectric ceramic sensors prepared by the above-mentioned electrode application and polarization methods in the comparative examples 1-4 are b1, b2, b3 and b4 respectively.

Testing the performance of the piezoelectric ceramic sensors prepared in the foregoing embodiments 1-4 and comparative examples 1-4, and the test results are shown in Table 2 below:

|    | piezoelectric coefficient d33/pC/N | dielectric constant ε33T/ε0 | dielectric loss tgδ | electro-mechanical coupling coefficient Kp | Curie temperature Tc/° C. |
|----|------|------|------|------|-----|
| B1 | 552  | 3764 | 0.25 | 0.65 | 242 |
| B2 | 564  | 3859 | 0.23 | 0.72 | 249 |
| B3 | 586  | 4122 | 0.15 | 0.79 | 252 |
| B4 | 570  | 4035 | 0.18 | 0.78 | 245 |
| b1 | 432  | 2560 | 0.62 | 0.51 | 192 |
| b2 | 526  | 3420 | 0.38 | 0.62 | 240 |
| b3 | 482  | 3080 | 0.42 | 0.58 | 203 |
| b4 | 530  | 3525 | 0.28 | 0.64 | 231 |

It can be seen from the test results in Table 2 that the piezoelectric ceramic sensor has a higher piezoelectric coefficient, that is, higher sensitivity and lower dielectric loss, which can ensure that the piezoelectric ceramic sensor loses less internal energy during long-term operation. Further, the piezoelectric ceramic sensor will not be broken due to its heating, and has a higher Curie temperature, which can still have better piezoelectric performance at higher temperatures. The present disclosure improves the piezoelectric performance of the piezoelectric sensor and reduces the dielectric loss by adding strontium carbonate. And by adding and synergizing $Er_2O_3$ and $Bi_2O_3$, the present disclosure significantly increases the piezoelectric coefficient and Curie temperature of the piezoelectric sensor and reduces the dielectric loss, and further, the present disclosure can enjoy a higher sensitivity.

The technical features of the above-mentioned embodiments can be combined arbitrarily. In order to make the description concise, all possible combinations of the technical features in the above-mentioned embodiments are not described. However, as long as there is no contradiction in the combination of these technical features, it should be considered as the scope of the specification.

The above-mentioned examples only express several embodiments of the present disclosure, and the description is more specific and detailed, but it should not be understood as a limitation on the scope of the present disclosure. It should be pointed out that for those of ordinary skill in the art, without departing from the concept of the present disclosure, several modifications and improvements can be made, and these all fall within the protection scope of the present disclosure.

What is claimed is:

1. A preparation method of a lead-free piezoelectric ceramic sensor material, comprising following steps:
   preparing ingredients: weighing and taking a required mass of main raw materials according to mass percentages of each main raw material, wherein the main raw materials include barium carbonate, calcium carbonate, zirconia, titanium dioxide, strontium carbonate, erbium oxide and bismuth oxide, and mixing the main raw materials uniformly to prepare a mixed raw materials, wherein the mass percentages of the main raw materials include 32.8-35.3% of the barium carbonate, 34.4-38.7% of the calcium carbonate, 8.5-10.3% of the zirconia, 8.6-11.0% of the titanium dioxide, 3.8-5.2% of the strontium carbonate, 2.4-3.7% of the erbium oxide, and 1.5-4.2% of the bismuth oxide;
   ball milling: adding the mixed raw materials into a high-energy ball mill, then adding a dispersant agent in a mass of ⅓ of 0.3-0.6% of the dispersant agent of a total amount of the main raw materials and a deionized water, starting a wet ball milling, and a mass ratio of the mixed raw materials and the deionized water is 1:1, a ball milling rate is 320-380 r/min, preforming the wet ball milling for 4-5 h; then continuing to adding lithium oxide in a mass of 0.21-0.35% of the total amount of the main raw materials, a mass of yttrium oxide in a mass of 0.18-0.29% of the total amount of the main raw materials and a mass of ⅔ of 0.3-0.6% of the dispersant agent of the total amount of the main raw materials into the high-energy ball mill, starting a secondary ball milling and the ball milling rate is 320-380 r/min, and preforming the secondary ball milling for 10 h;
   granulating and tableting: suction filtering a slurry after ball milling, and then processing the slurry after ball milling into a 400 mesh granular ceramic powder through a centrifugal spray dryer; uniformly mixing the 400 mesh granular ceramic powder with absolute ethyl alcohol in a mass ratio of 1:0.3, adding a composite binder in a mass of 3.5-4.5% of the total amount of the main raw materials, and after mixing uniformly, heating up to 70° C., stirring for 1 h, and then granulating into pellets; and placing the pellets in a stainless steel mold and pressing the pellets into a green body with a required thickness under a pressure of 12-18 MPa;
   debinding: putting the green body in a heating furnace, heating up to 200-250° C. for 60 minutes; and then heating up to 500-600° C. at a rate of 3-5° C/min for 2 h; then heating up to 720-780° C. for 3 h; and
   sintering: putting a debinding green body in a clamp pot, covering tightly, and sintering at 1050-1180° C. for 3-4 h; and then naturally cooling the debinding green body to a room temperature, preparing the lead-free piezoelectric ceramic sensor material.

2. The preparation method of the lead-free piezoelectric ceramic sensor material according to claim 1, wherein, in a process of the wet ball milling, a ball milling medium is a steel ball, wherein 5 kg of steel balls is added in the process of the wet ball milling.

3. The preparation method of the lead-free piezoelectric ceramic sensor material according to claim 1, wherein, in a process of the secondary ball milling, adding the deionized water into the high-energy ball mill, wherein 0.5 kg of the deionized water is added in the process of the secondary ball milling.

4. A preparation method for preparing a lead-free piezoelectric ceramic sensor with the lead-free piezoelectric ceramic sensor material according to claim 1, comprising the following steps:
   applying an electrode: cleaning the lead-free piezoelectric ceramic sensor material, and then using a screen printing technology to print a silver paste on an upper surface and a lower surface of the lead-free piezoelectric ceramic sensor material, and putting a printed silver product in the heating furnace, heating up to 800° C. for 50-60 minutes, cooling the printed silver product to the room temperature, and preparing a piezoelectric ceramic silver sheet; and
   polarizing: polarizing the piezoelectric ceramic silver sheet by a direct current electric field, a polarization temperature is from 110 to 130° C., a polarization time is 30 min, and a polarization field strength is 3-6 kV/mm and preparing the lead-free piezoelectric ceramic sensor.

5. The preparation method of the lead-free piezoelectric ceramic sensor material according to claim 1, wherein the composite binder is prepared by reacting a polyvinyl alcohol with a polysiloxane compound under an action of a triethanolamine, wherein a mass ratio of the polyvinyl alcohol and the polysiloxane compound is 1:0.8, wherein the polysiloxane compound is dimethylpolysiloxane.

6. A lead-free piezoelectric ceramic sensor material produced by the method of claim 1, wherein following main raw materials in terms of the mass percentage: the barium carbonate 32.8-35.3%, the calcium carbonate 34.4-38.7%, the zirconia 8.5-10.3%, the titanium dioxide 8.6-11.0%, the strontium carbonate 3.8-5.2%, the erbium oxide 2.4-3.7% and the bismuth oxide 1.5-4.2%, are used to produce the lead-free piezoelectric ceramic sensor material.

7. The lead-free piezoelectric ceramic sensor material according to claim 6, wherein further the lithium oxide, the yttrium oxide, the composite binder and the dispersant agent are used to produce the lead-free piezoelectric ceramic sensor wherein a mass of the lithium oxide is 0.21-0.35% of a total amount of the main raw materials and a mass of the yttrium oxide is 0.18-0.29% of the total amount of the main raw materials, a mass of the composite binder is 3.5-4.5% of the total amount of the main raw materials and a mass of the dispersant agent is 0.3-0.6% of the total amount of the main raw materials.

8. The lead-free piezoelectric ceramic sensor material according to claim 7, wherein the composite binder is prepared by reacting polyvinyl alcohol with polysiloxane compound under an action of triethanolamine; the polysiloxane compound is dimethylpolysiloxane and a mass ratio of the polyvinyl alcohol and the polysiloxane compound is 1: (0.5-0.8).

9. The lead-free piezoelectric ceramic sensor material according to claim 8, wherein: a preparation method of the composite binder, comprising:
adding 2 times a mass of the triethanolamine into the polyvinyl alcohol under a room temperature, adding the polysiloxane compound, and then stirring a mixture of the polyvinyl alcohol, the triethanolamine and the polysiloxane compound under a constant temperature of 60° C. for 1.5 hours, filtering, washing with the deionized water, and drying to obtain a required composite binder.

10. The lead-free piezoelectric ceramic sensor material according to claim 7, wherein the dispersant agent is one or more of sodium citrate, sodium silicate, sodium hexametaphosphate or sodium tripolyphosphate.

* * * * *